(12) United States Patent
Ahn et al.

(10) Patent No.: US 10,122,385 B2
(45) Date of Patent: Nov. 6, 2018

(54) METHOD AND APPARATUS FOR SHORTENING AND PUNCTURING NON-BINARY CODE

(71) Applicant: Samsung Electronics Co., Ltd., Gyeonggi-do (KR)

(72) Inventors: Seok-Ki Ahn, Suwon-si (KR); Woo-Myoung Park, Suwon-si (KR); Min Sagong, Suwon-si (KR); Chi-Woo Lim, Suwon-si (KR); Sung-Nam Hong, Anyang-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/505,913

(22) PCT Filed: Jul. 6, 2015

(86) PCT No.: PCT/KR2015/006947
§ 371 (c)(1),
(2) Date: Feb. 22, 2017

(87) PCT Pub. No.: WO2016/027981
PCT Pub. Date: Feb. 25, 2016

(65) Prior Publication Data
US 2017/0288706 A1    Oct. 5, 2017

(30) Foreign Application Priority Data
Aug. 22, 2014    (KR) .................. 10-2014-0109744

(51) Int. Cl.
H03M 13/00    (2006.01)
H03M 13/31    (2006.01)
H03M 13/11    (2006.01)

(52) U.S. Cl.
CPC ....... H03M 13/31 (2013.01); H03M 13/1171 (2013.01); H03M 13/6393 (2013.01)

(58) Field of Classification Search
CPC ............ H03M 13/31; H03M 13/1171; H03M 13/6393
See application file for complete search history.

(56) References Cited

U.S. PATENT DOCUMENTS 8,508,391 B1 *  8/2013  Li ..................... H03M 13/3746
                                                                    341/102
2009/0217130 A1    8/2009  Myung et al.
(Continued)

OTHER PUBLICATIONS

Lin Zhou, et al., "Design of Nonbinary Rate-Compatible LDPC Codes Utilizing Bit-Wise Shortening Method," IEEE Communications Letters, vol. 14, No. 10, Oct. 2010, pp. 963-965.

*Primary Examiner* — Sam Rizk

(57) ABSTRACT

The present disclosure relates to a pre-$5^{th}$-Generation (5G) or 5G communication system to be provided for supporting higher data rates Beyond 4th-Generation (4G) communication system such as Long Term Evolution (LTE). The present invention relates to a method and a device for efficiently shortening and puncturing a non-binary LDPC code, the method for a transmitter shortening and puncturing a non-binary code being capable of supporting various modulation methods by using a single non-binary code, and the method comprising the steps of: shortening, on the basis of a modulation method, at least one information bit in at least one information symbol constituting the non-binary code; encoding the at least one information symbol having a shortened information bit; and puncturing, on the basis of the modulation method, at least one parity code in at least one parity symbol obtained through the encoding step.

20 Claims, 9 Drawing Sheets

(56) References Cited

U.S. PATENT DOCUMENTS

| | | |
|---|---|---|
| 2011/0138262 A1 | 6/2011 | Myung et al. |
| 2011/0187565 A1 | 8/2011 | Jagmohan et al. |
| 2012/0044904 A1* | 2/2012 | Takano ............... H04W 72/046 370/329 |
| 2012/0216093 A1* | 8/2012 | Djordjevic ......... H03M 13/1171 714/755 |
| 2013/0013983 A1* | 1/2013 | Livshitz ............. H03M 13/1111 714/776 |
| 2013/0139025 A1* | 5/2013 | Gioulekas ............. H03M 13/13 714/752 |

* cited by examiner

2

METHOD AND APPARATUS FOR SHORTENING AND PUNCTURING NON-BINARY CODE

CROSS-REFERENCE TO RELATED APPLICATIONS AND CLAIM OF PRIORITY

The present application claims priority under 35 U.S.C. § 365 to International Patent Application No. PCT/KR2015/006947, which was filed on Jul. 6, 2015, and claims a priority to Korean Patent Application 10-2014-0109744, which was filed on Aug. 22, 2014, each of which are incorporated herein by reference into the present disclosure as if fully set forth herein.

TECHNICAL FIELD

The present invention relates a method and an apparatus for efficiently shortening and puncturing non-binary Low Density Parity Check (LDPC) code.

BACKGROUND ART

To meet the demand for wireless data traffic having increased since deployment of 4th generation (4G) communication systems, efforts have been made to develop an improved 5th generation (5G) or pre-5G communication system. Therefore, the 5G or pre-5G communication system is also called a 'Beyond 4G Network' or a 'Post LTE System'.

The 5G communication system is considered to be implemented in higher frequency (mmWave) bands, e.g., 60 GHz bands, so as to accomplish higher data rates. To decrease propagation loss of the radio waves and increase the transmission distance, the beamforming, massive multiple-input multiple-output (MIMO), Full Dimensional MIMO (FD-MIMO), array antenna, an analog beam forming, large scale antenna techniques are discussed in 5G communication systems.

In addition, in 5G communication systems, development for system network improvement is under way based on advanced small cells, cloud Radio Access Networks (RANs), ultra-dense networks, device-to-device (D2D) communication, wireless backhaul, moving network, cooperative communication, Coordinated Multi-Points (CoMP), reception-end interference cancellation and the like.

In the 5G system, Hybrid FSK and QAM Modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

A Low Density Parity Check (LDPC) code has an excellent performance for various channel states and modulation schemes. However, in the LDPC code, a length and a code rate of a code word are determined according to a parity check matrix. In order to overcome disadvantages of the LDPC that cannot support various code word lengths and code rates, information word shortening and parity puncturing are used to support a predetermined code word length and code rate.

In general, a non-binary code has a gain in terms of a channel capacity compared to a binary code in various channel states and modulation schemes. However, the non-binary code has a modulation scheme and a demodulation scheme that change according to a relation between a q value of a non-binary finite field GF (q) in which the code is defined and an M value that is a modulation order of a M-Quadrature Amplitude Modulation (QAM) modulation scheme. That is, the system should have a plurality of encoders and decoders that can support all of them to make an optimum performance, but this is not efficient in consideration of system complexity.

As a result, in various modulation schemes, using a single non-binary code may be a more efficient method. Accordingly, it may be required to provide a shortening and puncturing method using a single non-binary code in various modulation schemes.

DETAILED DESCRIPTION OF THE INVENTION

Technical Problem

Accordingly, an embodiment of the present invention provides a method and an apparatus for efficiently shortening and puncturing a non-binary Low Density Parity Check (LDPC) code.

Another embodiment of the present invention provides a method and an apparatus for performing shortening and puncturing to uniformly include modulation symbols in non-binary codes.

Another embodiment of the present invention provides a method and an apparatus for performing shortening and puncturing in consideration of a modulation symbol corresponding to a modulation scheme by a transmitter.

Another embodiment of the present invention provides a method and an apparatus for performing shortening and puncturing based on a code rate and/or a code length and a modulation scheme by a transmitter.

Technical Solution

According to an embodiment of the present invention, a method of a transmission end for shortening and puncturing a non-binary code includes: shortening at least one information bit in at least one information symbol included in a non-binary code based on a modulation scheme; encoding at least one information symbol in which the information bits are shortened; and puncturing at least one parity code in at least one parity symbol acquired through the encoding based on the modulation scheme.

According to an embodiment of the present invention, an apparatus of a transmission end for shortening and puncturing a non-binary code includes: an information bit shortening performing unit for shortening at least one information bit in at least one information symbol included in a non-binary code based on a modulation scheme; an encoding unit for encoding at least one information symbol in which the information bits are shortened; and a parity bit puncturing performing unit for puncturing at least one parity code in at least one parity symbol acquired through the encoding based on the modulation scheme.

Effects of the Invention

In the present invention, a transmission end may shorten information bits to include bits corresponding to a modulation order in each of the information symbols included in a non-binary code as uniformly as possible, acquire at least one parity symbol by encoding the information symbols in which the information bits have been shortened, and then select and puncture parity bits to include bits corresponding to the modulation order in each of the parity symbols as uniformly as possible, thereby supporting various modulation schemes based on a single non-binary code.

MODE FOR CARRYING OUT THE INVENTION

Hereinafter, exemplary embodiments of the present invention will be described with reference to the accompanying drawings. Further, in the following description of the present invention, a detailed description of known functions or configurations incorporated herein will be omitted when it may make the subject matter of the present invention rather unclear. Further, terms described later are defined in consideration of functions of the present invention, but may vary according to the intention or convention of a user or operator. Therefore, the definitions of the terms should be made based on the contents throughout the specification.

In an embodiment of the present invention, a method of shortening and puncturing information bits and parity bits constituting a non-binary code will be described to support various modulation schemes using a single non-binary LDPC code.

Figure 1:
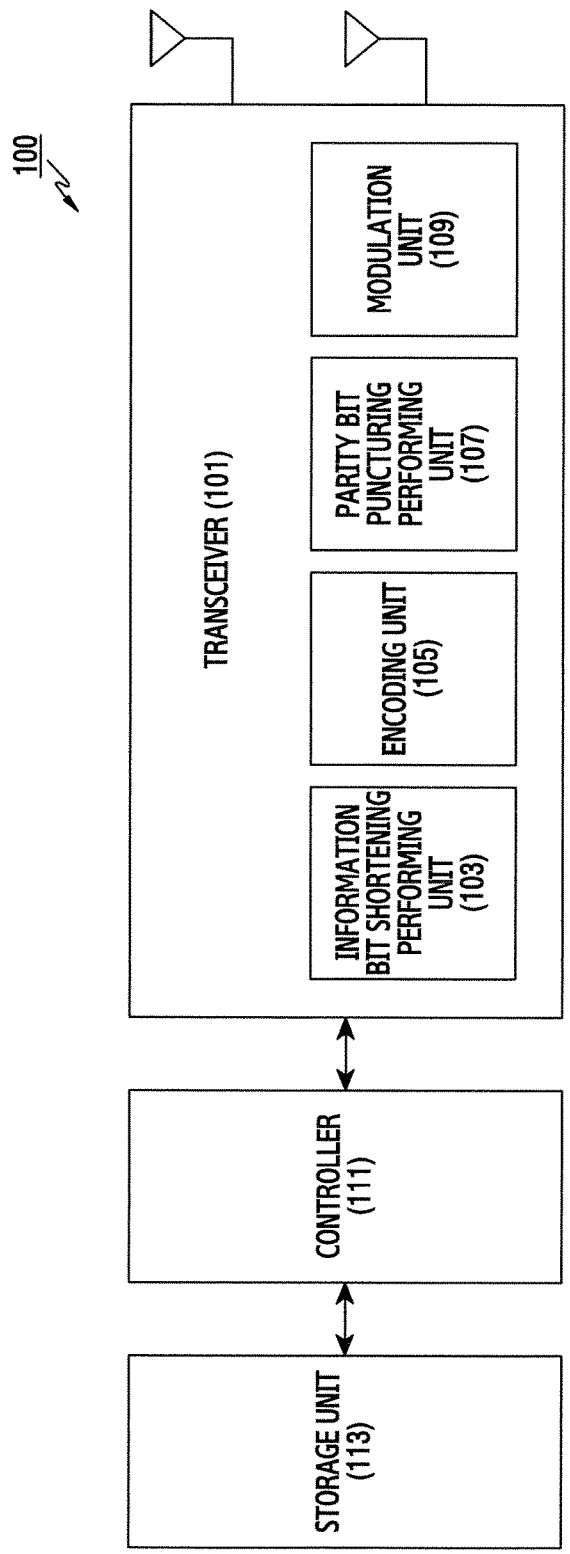
FIG. 1 is a block diagram illustrating a transmission end in a communication system according to an embodiment of the present invention.

FIG. 1 is a block diagram illustrating a transmission end in a communication system according to an embodiment of the present invention.

At this time, the transmission end may be a device such as a base station, a terminal, or the like that transmits a signal.

Referring to FIG. 1, a transmission end 100 may include a transceiver 101, a controller 111, and a storage unit 113.

The transceiver 101 controls and processes a function for transmitting and receiving a signal to and from a reception end according to a control of the controller 111. Particularly, although the transceiver 101 according to an embodiment of the present invention may be configured as one module for convenience of the description, the transceiver 101 may be configured as a transmitter and a receiver separated from each other according to a design method.

The transceiver 101 according to an embodiment of the present invention may include an information bit shortening performing unit 103, an encoding unit 105, a parity bit puncturing performing unit 107, and a modulation unit 109, and may shorten and encode information bits within the non-binary code and then perform a function for puncturing parity bits within the non-binary code.

Figure 2:
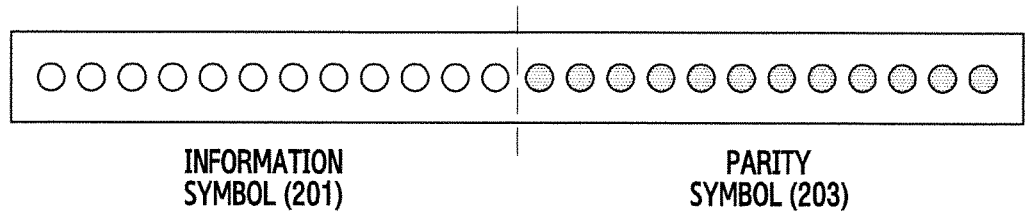
FIG. 2 illustrates a non-binary code according to an embodiment of the present invention.

The information bit shortening performing unit 103 may select at least one bit to be shortened according to a modulation order corresponding to a modulation scheme in at least one information symbol constituting the non-binary code. At this time, the non-binary code may include an information symbol 201 including at least one information bit and a parity symbol 203 including at least one parity bit as illustrated in FIG. 2. The information bit shortening performing unit 103 may select and shorten the information bits such that bits corresponding to a modulation order are included in each information symbol constituting the non-binary code as uniformly as possible. The information bit shortening performing unit 101 according to an embodiment of the present invention may determine the number of bits to be shortened based on a code rate and/or a code length, select information bits to be shortened to most uniformly include bits corresponding to a modulation order in each information symbol constituting the non-binary code based on the number of bits and the modulation order, and shorten the selected information bits. The information bit shortening performing unit 103 according to another embodiment of the present invention may shorten other bits except for the bits corresponding to the modulation order within each information symbol constituting the non-binary code based on the modulation order. At this time, the information bit shortening performing unit 103 may check whether additional shortening is needed based on the code rate and/or the code length and, when the additional shortening is needed, perform shortening in the unit of information symbols according to the code rate and/or the code length. Here, the shortened bit refers to a bit considered to have a 1 chance of being 0 and a 0 change of being 1. According to an embodiment of the present invention, a method of shortening information bits to make bits corresponding to the modulation order included as uniformly as possible will be described in detail with reference to the following drawings.

The encoding unit 105 may encode at least one information symbol having the information bits shortened by the information bit shortening performing unit 103. More specifically, the encoding unit 105 may perform an LDPC encoding on at least one information symbol having the shortened information bits, so as to acquire an LDPC code word to which at least one parity symbol is added.

The parity bit puncturing performing unit 107 may select at least one bit to be punctured according to a modulation order in at least one parity symbol within the LDPC code word acquired by the encoding unit 105. The parity bit puncturing performing unit 107 may select and puncture parity bits such that bits corresponding to the modulation order are included in each parity symbol constituting the non-binary code as uniformly as possible. The parity bit puncturing performing unit 107 according to an embodiment of the present invention may select parity bits to be punctured such that bits corresponding to the modulation order are included in at least one parity symbol within the LDPC code word as uniformly as possible based on the number of shortened bits and the modulation order, and may puncture the selected parity bits. The parity bit puncturing performing unit 107 according to another embodiment of the present invention may puncture other bits except for the bits corresponding to the modulation order in at least one parity symbol within the LDPC code based on the modulation order. At this time, the parity bit puncturing performing unit 107 may check whether additional puncturing is needed based on the code rate and/or the code length and, when the additional puncturing is needed, perform puncturing in the unit of information symbols according to the code rate and/or the code length. Here, the punctured bit refers to a bit considered to have a ½ chance of being 0 and a ½ chance of being 1. At this time, a location of the punctured parity bit of the parity symbol may correspond to a location of the shortened information bit of the information symbol.

The modulation unit 109 may modulate the shortened and punctured non-binary code according to a predetermined modulation scheme.

The controller 111 may control and process a general operation of the transmission end 100 to shorten and puncture the non-binary code.

The storage unit 113 may store various types of data and programs required for the operation of the transmission end. According to an embodiment of the present invention, the storage unit 111 may store information on a code rate and/or a code length required by the system in the information symbol.

Figure 3:
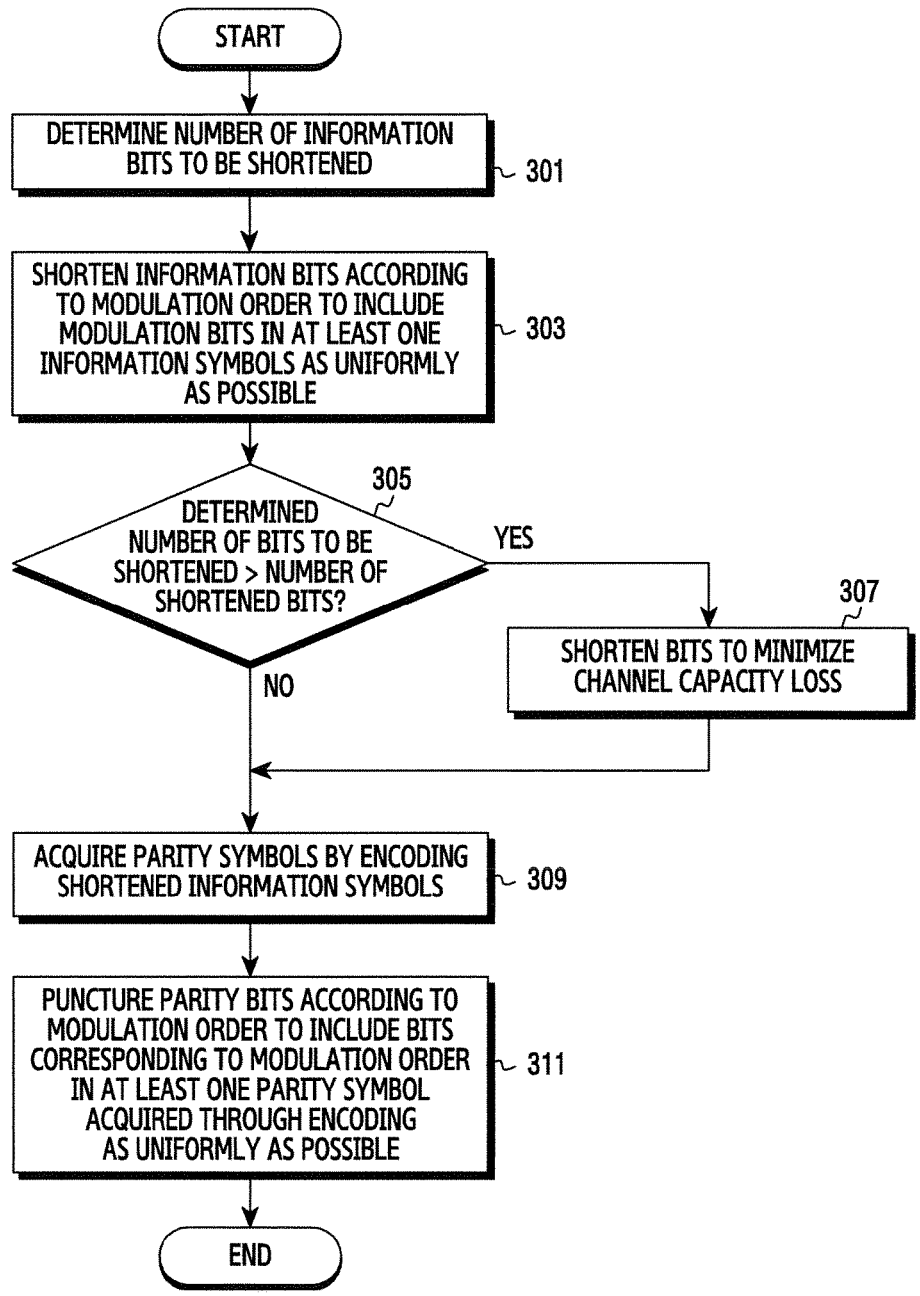
FIG. 3 illustrates a process of shortening and puncturing bits of a non-binary code in a communication system according to an embodiment of the present invention.
Figure 4:
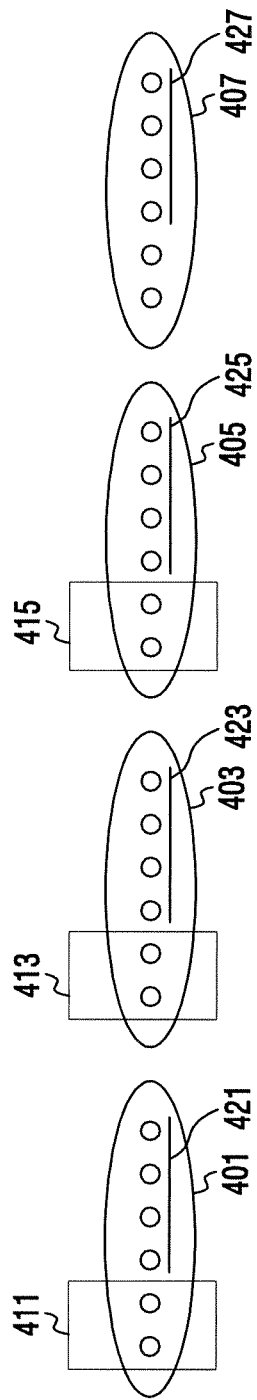
FIG. 4 illustrates an example of shortening information bits of a non-binary code in a communication system according to an embodiment of the present invention.
Figure 5:
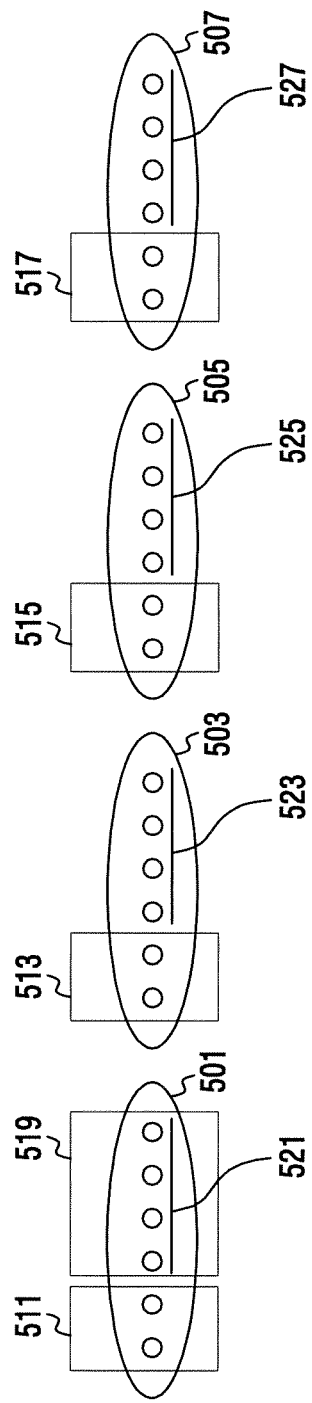
FIG. 5 illustrates another example of shortening information bits of a non-binary code in a communication system according to an embodiment of the present invention.

FIG. 3 illustrates a procedure of, when the number of bits to be shortened is predetermined in a communication system, shortening and puncturing bits of the non-binary code according to an embodiment of the present invention.

Referring to FIG. 3, the transmission end 100 may determine the number of information bits to be shortened in step 301. In other words, the transmission end 100 may determine the number of information bits to be shortened within the information symbol constituting the non-binary code based on the code rate and/or the code length required by the system. For example, the transmission end 100 may identify that 6 information bits within the information symbol should be shortened based on the code rate and/or the code length required by the system.

Thereafter, the transmission end 100 may shorten the information bits according to a modulation order of the modulation scheme such that modulation bits are included in at least one information symbol as uniformly as possible in step 303. For example, when the number of information bits to be shortened is 6 and the non-binary LDPC code designed in the non-binary finite field GF (64) supports 16 Quadrature Amplitude Modulation (QAM), the transmission end 100 may perform shortening three times 411 to 415, by two bits each, in the information symbols 401 to 407 in order to include the lower four bits 421 to 427 corresponding to the modulation order 16 in each of the information symbols 401 to 407 as uniformly as possible. In another example, when the number of information bits to be shortened is 8 and the non-binary LDPC code designed in the non-binary finite field GF (64) supports 16 QAM, the transmission end 100 may perform shortening four times, by two bits each, in the information symbols in order to uniformly include the lower four bits corresponding to the modulation order 16 in each information symbol. In another example, when the number of information bits to be shortened is 3 and the non-binary LDPC code designed in the non-binary finite field GF (64) supports 32 QAM, the transmission end 100 may perform shortening three times, by one bit each, in the information symbols in order to uniformly include the lower five bits corresponding to the modulation order 32 in each information symbol in order to include lower four bits 421 to 427 in each of the information symbols 401 to 407 as uniformly as possible. In another example, when the number of information bits to be shortened is 4 and the non-binary LDPC code designed in the non-binary finite field GF (64) supports 32 QAM, the transmission end 100 may perform shortening four times, by one bit each, in the information symbols in order to uniformly include the lower five bits corresponding to the modulation order 32 in each information symbol.

Thereafter, the transmission end 100 may identify whether the determined number of bits to be shortened is larger than the number of shortened bits in step 305.

When the predetermined number of bits to be shortened is larger than the number of shortened bits, the transmission end 100 may shorten the bits to minimize a channel capacity loss in step 307. For example, when the number of information bits to be shortened is 12 and the non-binary LDPC code designed in the non-binary finite field GF (64) supports 16 QAM, the transmission end 100 performs shortening four times 511 to 517, by two bits each, in the information symbols 501 to 507 in order to uniformly include the lower four bits 521 to 527 corresponding to the modulation order 16 in each of the information symbols 501 to 507. However, in this event, 8 bits have been shortened, which are smaller than 12 bits corresponding to the number of bits to be shortened determined in step 301, and thus, four more bits should be shortened. Accordingly, the transmission end 100 may perform shortening of 4 bits 519 in the unit of information symbols to minimize the channel capacity loss. Therefore, the transmission end 100 may perform the shortening such that as many bits corresponding to the modulation order as possible are included in each information symbol constituting the non-binary code.

Thereafter, the transmission end 100 may acquire parity symbols by encoding the shortened information symbols in step 309. For example, the transmission end 100 may acquire parity symbols including at least one parity bit by performing an LDPC encoding on the shortened information symbols.

Thereafter, the transmission end 100 may puncture the parity bits according to the modulation order such that bits corresponding to the modulation order are included in at least one parity symbol acquired through the encoding as uniformly as possible in step 311. At this time, the transmission end 100 may puncture the parity bits within the parity symbol in the same way as that of shortening the information bits within the information symbol. In other words, a location of the punctured parity bit of the parity symbol may correspond to a location of the shortened information bit.

In contrast, when the number of bits to be shortened determined in step 305 is not larger than the number of shortened bits, the transmission end 100 may proceed to step 309 and perform the following steps. In other words, when the number of bits to be shortened, which is determined in step 301, is the same the number of bits shortened in step 303, the transmission end 100 may proceed to step 309 and perform the following steps.

Thereafter, the transmission end 100 may end the procedure according to the embodiment of the present invention.

Figure 6:
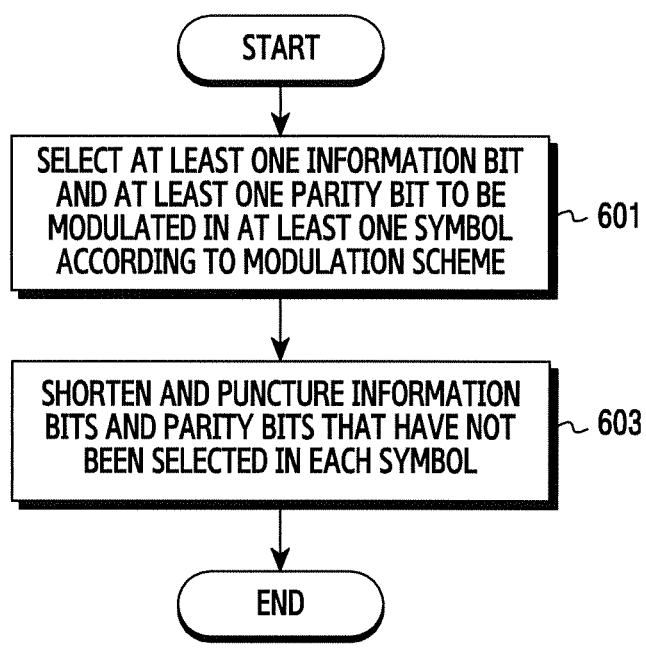
FIG. 6 illustrates a process of shortening and puncturing bits of a non-binary code in a communication system according to another embodiment of the present invention.

FIG. 6 illustrates a procedure of, when the number of bits to be shortened is not predetermined, shortening and puncturing bits of the non-binary code in the communication system according to an embodiment of the present invention.

Referring to FIG. 6, the transmission end 100 may select at least one information bit and at least one parity bit to be modulated according to a modulation order of a modulation scheme within at least one symbol in step 601. More specifically, the transmission end 100 may determine at least one information bit to be modulated within at least one information symbol and determine at least one parity bit to be modulated within at least one parity symbol based on the modulation order. For example, the transmission end 100 may select bits corresponding to the modulation order within at least one information symbol as the bits to be modulated and determine the remaining bits except for the selected bits as the bits to be shortened. Further, the transmission end 100 may select bits corresponding to the modulation order within at least one parity symbol as the bits to be modulated and determine the remaining bits except for the selected bits as the bits to be punctured.

Thereafter, the transmission end 100 may shorten and puncture the information bits and the parity bits that have not been selected within each symbol in step 605. In other words, the transmission end 100 may shorten the remaining information bits except for the information bits to be modulated within at least one information symbol and puncture the remaining parity bits except for the parity bits to be modulated within at least one parity symbol.

Thereafter, the transmission end 100 may end the procedure according to the embodiment of the present invention.

Figure 7:
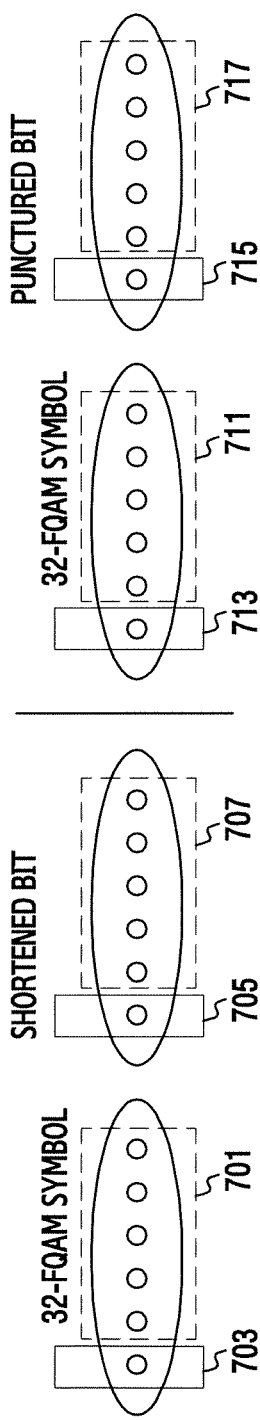
FIG. 7 illustrates an example of shortening and puncturing information bits of a non-binary code in a communication system according to another embodiment of the present invention.
Figure 8:
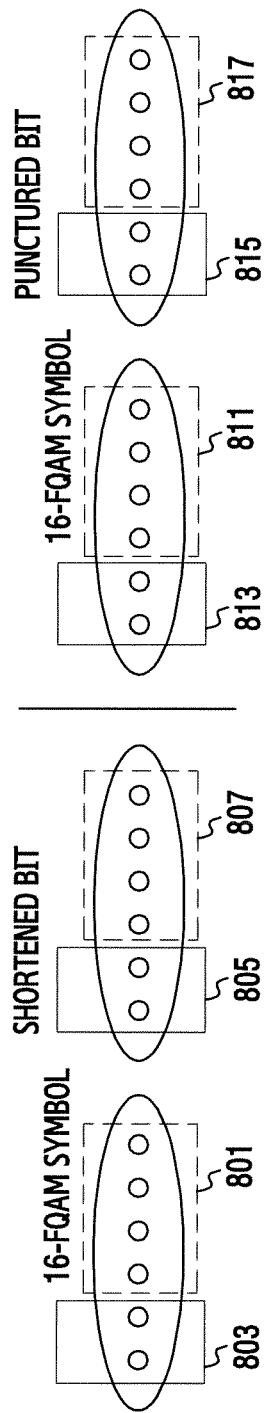
FIG. 8 illustrates another example of shortening and puncturing information bits of a non-binary code in a communication system according to another embodiment of the present invention.

FIG. 6 described above illustrates a method by which the transmission end 100 shortens and punctures the non-binary code in consideration of only the modulation order corresponding to the modulation scheme. For example, when the non-binary LDPC code designed in the non-binary finite field GF (64) supports 32 FQAM, the transmission end 100 may select lower 5 bits 701 and 707 corresponding to a modulation order 32 within the information symbol as information bits to be modulated and select lower 5 bits 711 and 711 corresponding to the modulation order 32 within the parity symbol as 5 bits of parity bits to be modulated, and may then shorten the remaining information bits 703 and 705 that have not been selected and puncture the remaining parity bits 713 and 715 that have not been selected as illustrated in FIG. 7. In another example, when the non-binary LDPC code designed in the non-binary finite field GF (64) supports 16 FQAM, the transmission end 100 may select lower 4 bits 801 and 807 corresponding to a modulation order 16 within the information symbol as information bits to be modulated and select lower 4 bits 801 and 807 corresponding to the modulation order 16 within the parity symbol as parity bits to be modulated, and may then shorten the remaining information bits 803 and 805 that have not been selected and puncture the remaining parity bits 813 and 815 that have not been selected as illustrated in FIG. 8.

In addition, when the shortening and the puncturing are performed using the method of FIG. 6, the transmission end 100 may check whether additional shortening and puncturing are needed based on the code rate and/or the code length required by the system. That is, the transmission end 100 may check whether as many bits as the number of bits to be shorted and to be punctured determined according to the code rate and/or the code length required by the system have been shortened and punctured. When it is determined that the as many bits as the number of bits to be shorted and to be punctured determined according to the code rate and/or the code length required by the system have not been shortened and punctured, the transmission end 100 may further perform the shortening and puncturing based the number of bits that are required to be shortened and punctured.

Figure 9:
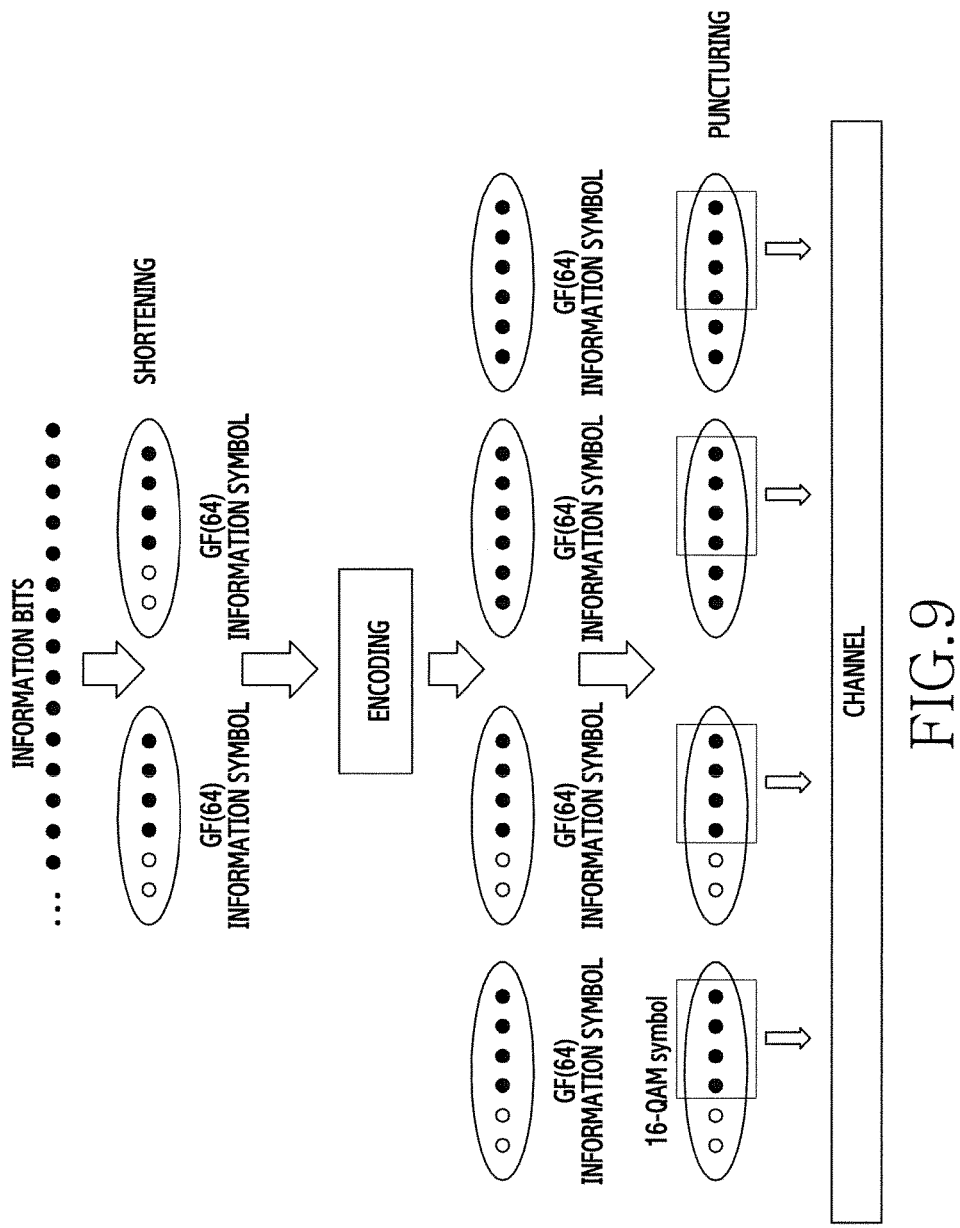
FIG. 9 illustrates an example of shortening and puncturing bits of a non-binary code in a communication system according to an embodiment of the present invention.

FIG. 9 illustrates an example of shortening and puncturing bits of the non-binary code in the communication system according to an embodiment of the present invention.

As illustrated in FIG. 9, the transmission end 100 may select and shorten information bits such that bits corresponding to a modulation order are included in each information symbols as uniformly as possible based on the modulation order of a modulation scheme in information symbols including at least one information symbol. Thereafter, the transmission end 100 may acquire an LDPC code word to which a parity symbol for each information symbol is added through an encoding of the shortened information symbols. The transmission end 100 may select parity bits to be punctured such that bits corresponding to the modulation order are included in at least one parity symbol included in the acquired LDPC code word as uniformly as possible, and may puncture the selected parity bits. Thereafter, the transmission end 100 may modulate the shortened and punctured LDPC code word and then transmit the modulated LDPC code word to a reception end through an antenna.

Embodiments and all functional operations described in the present invention may be carried out by computer software, firmware, hardware, or one or more combinations thereof, which include the structures disclosed in the present invention and equivalent structures thereof. Further, embodiments of the present invention described in the present invention may be executed by one or more computer program products, i.e. data processing devices, or carried out by one or more modules of computer program commands encoded in computer-readable media for controlling the operations of the devices.

A computer-readable medium may be a machine-readable storage medium, a machine-readable storage substrate, a memory device, a configuration of a material influencing a machine-readable electric wave stream, or one or more combinations thereof. The term "data processing device" includes, for example, a programmable processor, a computer, or all nodes, devices, and machines, including a multi-processor or computer, for processing data. The node may include, in addition to hardware, a code that creates an execution environment for a computer program, for example, a code that constitutes processor firmware, a protocol stack, a database management system, an operating system, or one or more combinations thereof.

Although specific exemplary embodiments have been described in the detailed description of the present invention, various change and modifications may be made without departing from the spirit and scope of the present invention. Therefore, the scope of the present invention should not be defined as being limited to the embodiments, but should be defined by the appended claims and equivalents thereof.

The invention claimed is:

1. A method of operating a transmitter in a wireless communication system, the method comprising:
   generating shortened information symbols by shortening at least one information bit from information symbols based on a modulation order;
   generating parity symbols by encoding the shortened information symbols;
   puncturing at least one parity bit from the parity symbols based on the modulation order; and
   transmitting, to a receiver, a signal that is generated by modulating the shortened information symbols and the parity symbols,
   wherein each of the shortened information symbols comprises information bits corresponding to the modulation order and the shortened at least one information bit; and wherein each of the parity symbols comprises parity bits corresponding to the modulation order and the punctured at least one parity bit.

2. The method of claim 1, wherein generating the shortened information symbols by shortening the at least one information bit from the information symbols comprises selecting the at least one information bit to be shortened in the information symbols based on the modulation order corresponding to a modulation scheme.

3. The method of claim 2, wherein selecting the at least one information bit to be shortened in the information symbols comprises:
determining a number of the at least one information bit to be shortened based on one or more of a required code rate and a code length; and
selecting the at least one information bit to be shortened in each of the information symbols based on the determined number of the at least one information bit to be shortened and the modulation order.

4. The method of claim 3, further comprising:
determining whether to perform additional shortening based on one or more of the required code rate and the code length; and
performing shortening in a unit of symbols based on one or more of the code rate and the code length in response to a result of the determination of the additional shortening.

5. The method of claim 2, wherein selecting the at least one information bit to be shortened in the information symbols comprises selecting other information bits except for the information bits corresponding to the modulation order in each of the information symbols based on the modulation order.

6. The method of claim 1, wherein puncturing the at least one parity bit from the parity symbols comprises selecting the at least one parity bit to be punctured in the parity symbols based on the modulation order corresponding to a modulation scheme.

7. The method of claim 6, further comprising:
determining whether additional puncturing is needed based on one or more of a required code rate and a code length; and
performing puncturing in a unit of parity symbols based on one or more of the code rate and the code length in response to a result of the determination of whether the additional puncturing is needed.

8. The method of claim 1, wherein locations of the at least one punctured parity bit of the parity symbols correspond to locations of the at least one shortened information bit of the information symbols.

9. The method of claim 6, wherein selecting the at least one parity bit to be punctured in the parity symbols comprises:
determining a number of the at least one parity bit to be punctured based on one or more of a required code rate and code length; and
selecting the at least one parity bit to be punctured in each of the parity symbols based on the number of the at least one parity bit to be punctured and the modulation order.

10. The method of claim 6, wherein selecting the at least one parity bit to be punctured in the parity symbols comprises selecting other parity bits except for the parity bits corresponding to the modulation order in each of the parity symbols based on the modulation order.

11. An apparatus of a transmitter in a wireless communication system, the apparatus comprising:

at least one processor configured to:
generate shortened information symbols by shortening at least one information bit from information symbols based on a modulation order;
generate parity symbols by encoding the shortened information symbols;
puncture at least one parity bit from the parity symbols based on the modulation order; and
transmit, to a receiver, a signal which is generated by modulating the shortened information symbols and the parity symbols,
wherein each of the shortened information symbols comprises information bits corresponding to the modulation order and the shortened at least one information bit, and
wherein each of the parity symbols comprises parity bits corresponding to the modulation order and the punctured at least one parity bit.

12. The apparatus of claim 11, wherein the at least one processor is further configured to select the at least one information bit to be shortened in the information symbols based on the modulation order corresponding to a modulation scheme.

13. The apparatus of claim 12, wherein the at least one processor is further configured to:
determine a number of the at least one information bit to be shortened based on one or more of a required code rate and a code length, and
select the at least one information bit to be shortened in each of the information symbols based on the determined number of the at least one information bit to be shortened and the modulation order.

14. The apparatus of claim 13, wherein the at least one processor is further configured to:
determine whether to perform additional shortening based on one or more of the required code rate and the code length; and
perform shortening in a unit of symbols based on one or more of the code rate and the code length in response to a result of the determination of the additional shortening.

15. The apparatus of claim 12, wherein the at least one processor is further configured to select other information bits except for the information bits corresponding to the modulation order in each of the information symbols based on the modulation order.

16. The apparatus of claim 11, wherein the at least one processor is further configured to select the at least one parity bit to be punctured in the parity symbols based on the modulation order corresponding to a modulation scheme.

17. The apparatus of claim 16, wherein the at least one processor is further configured to:
determine a number of the at least one parity bit to be punctured based on one or more of a required code rate and code length; and
select the at least one parity bit to be punctured in each of the parity symbols based on the number of the at least one parity bit to be punctured and the modulation order.

18. The apparatus of claim 17, wherein the at least one processor is further configured to:
determine whether additional puncturing is needed based on one or more of a required code rate and code length; and
perform puncturing in a unit of parity symbols based on one or more of the code rate and the code length in response to a result of the determination of whether the additional puncturing is needed.

19. The apparatus of claim 16, wherein the at least one processor is further configured to select other parity bits except for the parity bits corresponding to the modulation order in each of the parity symbols based on the modulation order.

20. The apparatus of claim 11, wherein locations of the at least one punctured parity bit of the parity symbols correspond to locations of the at least one shortened information bit of the information symbols.

* * * * *